United States Patent
Clark, Jr. et al.

(10) Patent No.: US 9,356,014 B2
(45) Date of Patent: May 31, 2016

(54) HIGH-VOLTAGE METAL-INSULATOR-SEMICONDUCTOR FIELD EFFECT TRANSISTOR STRUCTURES

(71) Applicant: INTERNATIONAL BUSINESS MACHINES CORPORATION, Armonk, NY (US)

(72) Inventors: William F. Clark, Jr., Essex Junction, VT (US); Qizhi Liu, Lexington, MA (US); John J. Pekarik, Underhill, VT (US); Yun Shi, South Burlington, VT (US); Yanli Zhang, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/522,652

(22) Filed: Oct. 24, 2014

(65) Prior Publication Data
US 2015/0041895 A1  Feb. 12, 2015

Related U.S. Application Data

(62) Division of application No. 13/566,404, filed on Aug. 3, 2012, now Pat. No. 8,916,440.

(51) Int. Cl.
*H01L 27/06* (2006.01)
*H01L 21/8249* (2006.01)
*H01L 21/8234* (2006.01)
*H01L 29/04* (2006.01)
(Continued)

(52) U.S. Cl.
CPC ........ *H01L 27/0623* (2013.01); *H01L 21/8249* (2013.01); *H01L 21/823418* (2013.01); *H01L 27/0922* (2013.01); *H01L 29/04* (2013.01); *H01L 29/161* (2013.01); *H01L 29/45* (2013.01); *H01L 29/735* (2013.01); *H01L 29/7817* (2013.01); *H01L 29/7835* (2013.01);

*H01L 27/088* (2013.01); *H01L 29/402* (2013.01); *H01L29/66659* (2013.01); *H01L 29/7302* (2013.01); *H01L 29/78* (2013.01)

(58) Field of Classification Search
CPC ................... H01L 21/823418; H01L 21/8249; H01L 21/0623; H01L 21/088; H01L 29/402
USPC ............ 257/335, 336, 370, E21.37, E21.407; 438/202, 234, 275, 300
See application file for complete search history.

(56) References Cited

U.S. PATENT DOCUMENTS 5,340,756 A * 8/1994 Nagayasu ....... H01L 21/823468
                                                    257/E21.626
5,852,314 A   12/1998 Depetro et al.
(Continued)

OTHER PUBLICATIONS

Min, Liu et al., "A Fully Resurfed, BiCMOS-Compatible, High Voltage MOS Transistor", presented at the Power /TQ/ 1 Semiconductor Devices and ICs, 1996. ISPSD '96 Proceedings, 8th International Symposium, Issue Date: May 20-23 1996, pp. 143-146, Meeting Date: May 20-23, 1996, Location: Maui, HI , USA.

*Primary Examiner* — Julio J Maldonado
*Assistant Examiner* — Cory Eskridge
(74) *Attorney, Agent, or Firm* — Michael Lestrange; Andrew M. Calderon; Roberts Mlotkowski Safran & Cole, P.C.

(57) ABSTRACT

Semiconductor structures and methods of manufacture are disclosed herein. Specifically, disclosed herein are methods of manufacturing a high-voltage metal-oxide-semiconductor field-effect transistor and respective structures. A method includes forming a field-effect transistor (FET) on a substrate in a FET region, forming a high-voltage FET (HVFET) on a dielectric stack over a over lightly-doped diffusion (LDD) drain in a HVFET region, and forming an NPN on the substrate in an NPN region.

12 Claims, 14 Drawing Sheets

(51) Int. Cl.
  H01L 27/092 (2006.01)
  H01L 29/161 (2006.01)
  H01L 29/45 (2006.01)
  H01L 29/735 (2006.01)
  H01L 29/40 (2006.01)
  H01L 27/088 (2006.01)
  H01L 29/78 (2006.01)
  H01L 29/66 (2006.01)
  H01L 29/73 (2006.01)

(56) References Cited

U.S. PATENT DOCUMENTS

| | | |
|---|---|---|
| 6,118,157 A | 9/2000 | Bergemont |
| 6,191,457 B1 | 2/2001 | Prengle et al. |
| 6,825,531 B1 | 11/2004 | Mallikarjunaswamy |
| 7,374,982 B2 * | 5/2008 | Hebert ................ H01L 29/402 257/331 |
| 7,759,759 B2 | 7/2010 | Tsuchiko |
| 7,820,517 B2 | 10/2010 | Gammel et al. |
| 7,999,315 B2 | 8/2011 | Cai |
| 8,071,436 B2 | 12/2011 | You et al. |
| 8,482,077 B2 * | 7/2013 | Lee ................ H01L 21/823412 257/369 |
| 2007/0296022 A1 | 12/2007 | Lu et al. |
| 2008/0217693 A1 | 9/2008 | Wang et al. |
| 2009/0068807 A1 | 3/2009 | Karve et al. |
| 2010/0301412 A1 | 12/2010 | Parthasarathy et al. |
| 2011/0024839 A1 | 2/2011 | Zinn et al. |
| 2011/0127602 A1 | 6/2011 | Mallikarjunaswamy |

* cited by examiner

HIGH-VOLTAGE METAL-INSULATOR-SEMICONDUCTOR FIELD EFFECT TRANSISTOR STRUCTURES

FIELD OF INVENTION

The invention relates to semiconductor structures and methods of manufacture and, more particularly to manufacturing high-voltage metal-oxide-semiconductor field-effect transistors.

BACKGROUND

BiCMOS is a semiconductor technology that integrates a bipolar junction transistor and a CMOS transistor in a single integrated circuit device. Bipolar junction transistors offer high speed, high gain, and low output resistance, which are useful in high-power applications, such as amplifiers. CMOS transistors, on the other hand, have a high input resistance, which is useful in low-power applications, such as logic gates. Current BiCMOS devices, however, can have limited power output. Further, implementing a new, separate process to manufacture high-voltage BiCMOS devices is expensive.

Accordingly, there exists a need in the art to overcome the deficiencies and limitations described hereinabove.

BRIEF SUMMARY

In an aspect of the invention there is a method of manufacturing a high-voltage metal-oxide-semiconductor field-effect transistor. The method comprises forming a field-effect transistor (FET) on a substrate in a FET region. The method further comprises forming a high-voltage FET (HVFET) on a dielectric stack over a lightly-doped diffusion (LDD) drain in a HVFET region. The method further comprises forming an NPN on the substrate in an NPN region.

In another aspect of the invention, there is a method comprising forming a first FET in a FET region of a substrate. The method further comprises forming a HVFET in a HVFET region of the substrate, where the HVFET includes a raised gate and a dielectric stack on a laterally diffused drain region. The method further comprises forming a NPN transistor in a NPN region of the substrate.

In another aspect of the invention, there is a structure for a high-voltage metal-oxide-semiconductor field-effect transistor structure. The structure comprises a FET on a substrate in a FET region, a HVFET on a dielectric stack over a LDD drain in the substrate in a HVFET region, and an NPN on the substrate in an NPN region.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

The invention relates to semiconductor structures and methods of manufacture and, more particularly, to manufacturing high-voltage metal-oxide-semiconductor field-effect transistors (MOSFET). The methods and structures according to embodiments disclosed herein provide a combined, high-performance BiCMOS, high-speed digital MOSFET, and high-voltage laterally diffused metal oxide semiconductors (LDMOS) integrated on single silicon substrate for system-on-chip (SOC) applications. Further, the methods and structures according to embodiments of the present invention provide a combined, high-performance BiCMOS, high-speed digital MOSFET and high-Vgs FET (HVFET) integrated on single silicon substrate for system-on-chip (SOC) applications. The semiconductor structures of the present invention are disclosed as a LDMOS; however, those of skill in the art should recognize that embodiments of the invention are not limited to LDMOS. For example, the disclosed semiconductor structures and processes of the present invention are applicable to LDNMOS and LDPMOS devices with or without shallow-trench isolation (STI) or High Voltage CMOS technologies.

In embodiments, conventional CMOS fabrication processes are used to form a lateral diffused MOSFET (LDMOS), as well as other structures defined herein. By utilizing the films used in existing BiCMOS processes, the present invention minimizes the marginal manufacturing cost when compared to providing a new and/or separate manufacturing process. For example, in the present invention, no additional mask steps are added to conventional BiCMOS processes to manufacture the structures of the present invention. Advantageously, the disclosed structures also provide performance gains by optimizing the on-resistance (Ron) versus breakdown voltage (BV) trade off, as well as hot carrier injection (HCI) performance. Moreover, in embodiments, the LDMOS can include a HVFET having an output of greater than 5 volts (V). The FET can also include trench isolation structures (e.g., shallow trench isolation) to support higher Vds. Further, the FET can be symmetric or asymmetric. Advantageously, the methods and structures of the present invention provide for high-speed SOCs with on-chip power management.

Figure 1:
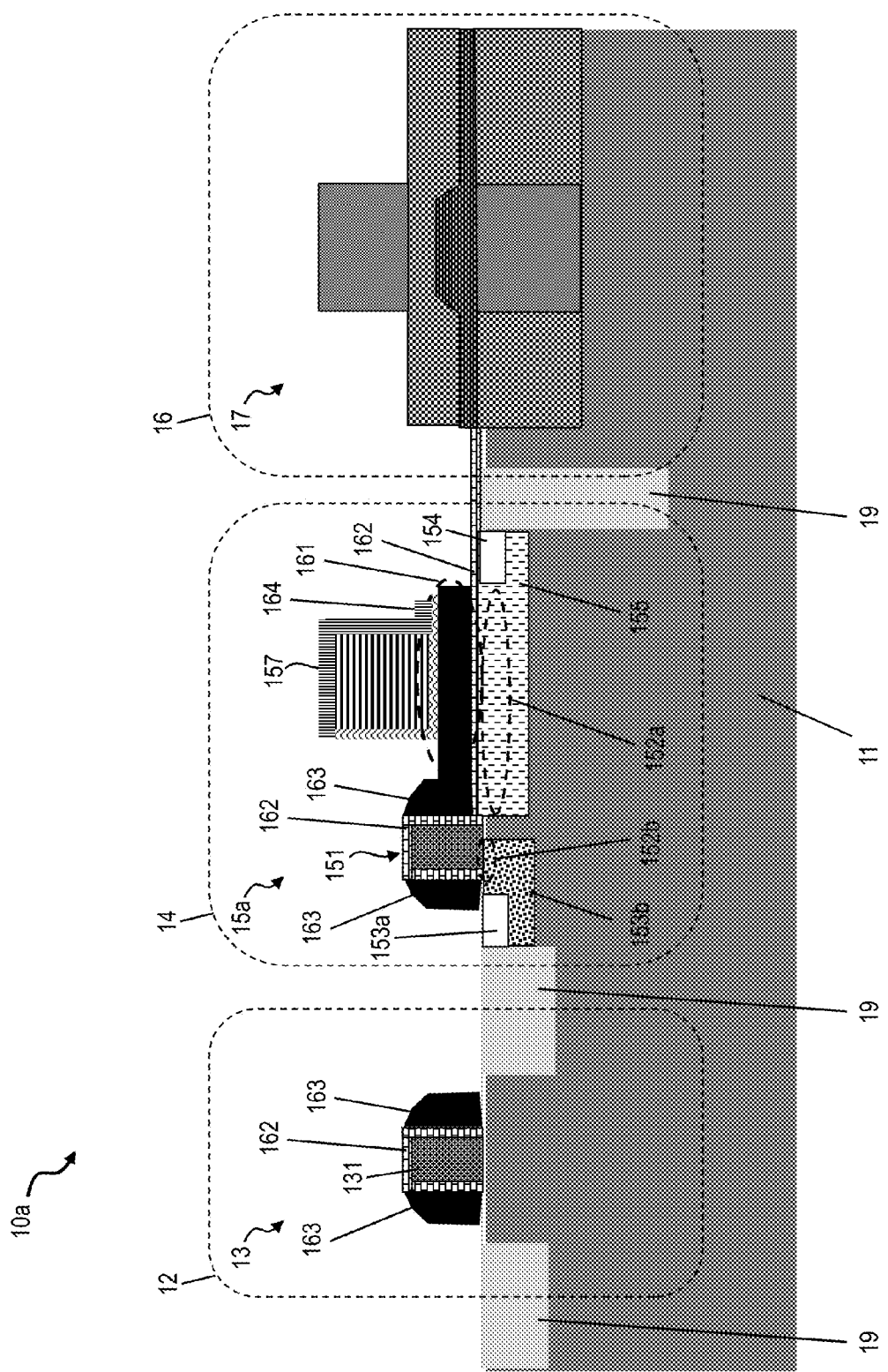
FIG. 1 shows an exemplary semiconductor structure in accordance with aspects of the present invention.

FIG. 1 shows an exemplary semiconductor structure in accordance with aspects of the present invention. According to embodiments of the present invention, the semiconductor structure 10a of FIG. 1 includes an LDMOS 15a having a control gate 151 and a raised gate (i.e., "split gate") 157 that functions as a field plate over a lightly-doped diffusion (LDD) drain structure 155. In addition, the raised gate 157 includes a dielectric stack 161 over the LDD drain 155 that positions the rasied gate 157 at a raised position over the LDD drain 155 relative to the control gate 151.

More specifically, in embodiments, the semiconductor structure 10a of FIG. 1 includes a substrate 11, with a field-effect transistor ("FET") region 12, an HVFET region 14, and a NPN region 16, with isolation structures 19 therebetween. In embodiments, the FET region 12 includes a FET 13, the HVFET region 14 includes a LDMOS transistor 15a having the control gate 151 and the raised gate 157, and the NPN region 16 includes a NPN transistor 17. It should be understood by those of skill in the art that there may be crossover between the regions 12, 14, and 16 depending on the layout of the semiconductor structure 10a.

In embodiments, the substrate 11 can be any conventional substrate, such as Si, BULK, SOI or SiGe, for example. Also, as should be understood by those of skill in the art, the FET 13, the NPN transistor 17 and the isolation structures 19 are conventional structures that are formed on the substrate 11 using conventional techniques consistent with the process disclosed herein.

In accordance with aspects of the invention, the LDMOS transistor 15a has a split gate structure, including the control gate 151 and the raised gate 157. In embodiments, the control gate 151 is located over channel region 152b. The channel region 152b connects a source contact 153a of a p-well 153b, a laterally diffused drain region 152a and a drain contact 154 of a LDD region 155. The LDMOS transistor 15a further includes the raised gate 157, which can be an HVFET. The raised gate 157 is located over the LDD region 155, which provides a drift region having reduced surface field ("ReSurf") design. More specifically, the split gate structure of the LDMOS transistor 15a (including the control gate 151 and the raised gate 157) provides a low vertical field (Ey) over the LDD drain 155. In embodiments, the raised gate 157 is raised, as described herein.

The LDMOS transistor 15a includes a dielectric stack 161 adjacent to the control gate 151 and formed under the raised gate 157. In accordance with aspects of the invention, the dielectric stack 161 comprises three films including: oxide layer 162, nitride layer 163, and oxide layer 164. In embodiments, the dielectric stack 161 does not require any high-K material. The layers 162, 163 and 164 provide for lower Ey and a resurface condition that allows the device to withstand relatively high voltages.

In embodiments, the oxide layer 162 is formed directly on an upper surface of the LDD region 155 and below the raised gate 157, using conventional deposition and etching processes. The oxide layer 162 can be any conventional oxide (e.g., $SiO_2$). In embodiments, the oxide layer 162 is about 200 Å thick (although other dimensions are also contemplated by the present invention) and spans the surface of the substrate 11 from the raised gate 157 into the NPN region 16. Further, in accordance with aspects of the invention, the oxide layer 162 of the LDMOS transistor 15a is formed in the same process step as the oxide layer 162 over gate structure 131 of the FET 13 and of the control gate 151.

Still referring to FIG. 1, the nitride layer 163 is formed directly on the upper surface of the oxide layer 162. In embodiments, the nitride layer 163 is about 700 Å thick; although other dimensions are also contemplated by the present invention. In embodiments, the nitride layer 163 can be used to form the sidewall spacers of the FET 13, in addition to the sidewall spacers of the control gate 151. The oxide layer 164 is formed directly on the upper surface of the nitride layer 163 and can be comprised of any conventional oxide (e.g., $SiO_2$). In embodiments, the oxide layer 164 is about 150 Å thick; although other dimensions are also contemplated by the present invention.

The isolation structures 19 separating the regions 12, 14, and 16 may be shallow trench isolation (STI) structures or deep trench isolation (DTI) structures. The isolation structures 19 can be formed using conventional CMOS processes. For example, one or more trenches can be formed in the substrate 11 using a conventional lithography and etching processes (reactive ion etching (RIE)), and depositing insulator material, e.g., oxide, to fill the trench. Any excess material can be removed using chemical-mechanical polishing (CMP), as is known to those of skill in the art. The insulator material can be deposited using any well known deposition process, e.g., chemical vapor deposition (CVD).

The LDMOS 15a in FIG. 1 is an asymmetric device, such that Vds does not equal Vgs. This lack of symmetry, for example, allows higher voltage between the source 153a and the drain 154. Further, the split gate structure of the LDMOS transistor 15a lowers the LDD region resistance, Further, the oxide over the LDD/drift region 155 provides the structure with improved reliability characteristics, such as prompt shift.

Further, as shown in FIG. 1, the LDMOS 15a has a stepped profile that is provided by the dielectric stack 161, in which the raised gate 157 is raised relative to the control gate 155. More specifically, the lower surface of the raised gate 157 is disposed directly on the upper surface of the dielectric stack 161; whereas, the lower surface of the control gate 155 is at the level of the upper surface of the substrate 11. As such, the lower surface of the raised gate 157 is higher than the lower surface of the control gate 155. The stepped profile allows the gate oxide 162 in the control gate 151 to share a digital thermal oxide of the same thickness.

Figure 2:
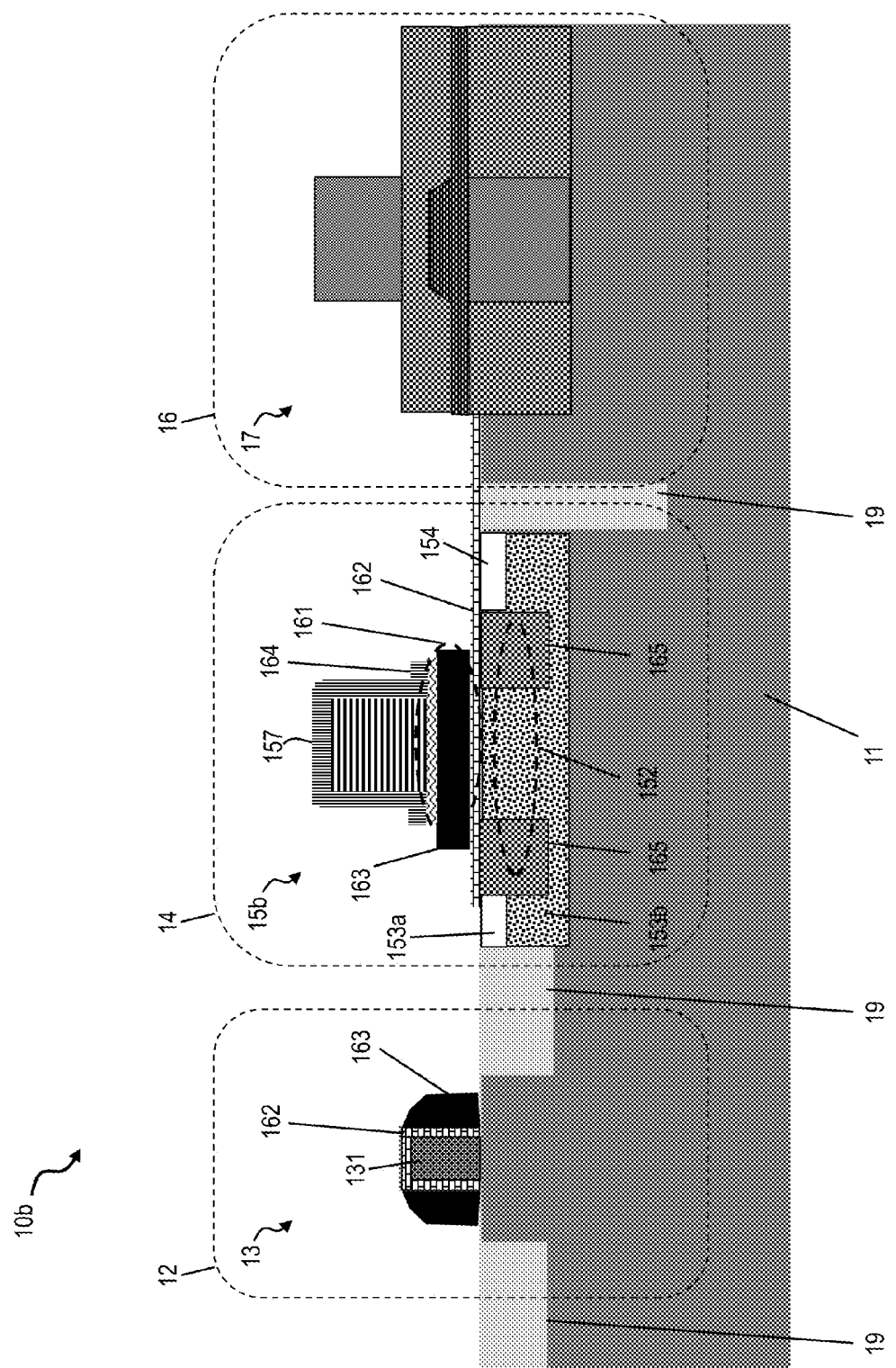
FIG. 2 shows an exemplary semiconductor structure in accordance with aspects of the present invention.

FIG. 2 shows an alternative semiconductor structure in accordance with aspects of the present invention. The semiconductor structure 10b includes elements already described above; however, in the embodiment of FIG. 2, the HVFET region 14 utilizes the raised gate 157 as a control gate to turn on/off the channel. More specifically, semiconductor structure 10b includes the raised gate 157 within the HVFET region 14. In this embodiment, the HVFET 15b can have a symmetric (i.e., Vgs=Vds) or asymmetric structure (i.e., Vgs≠Vds), allowing for high-voltage on either the source or the drain (i.e., Vgs=Vgd). In particular, the structure of the HVFET 15b allows Vgs or Vgd of greater than or equal to about 5V; whereas a conventional transistor is limited to about sub-1V to 5V.

As shown in FIG. 2, the HVFET 15b can be located on the dielectric stack 161, which is formed over the channel region 152 in the p-well 153b, between the source contact 153a and the drain contact 154 of the HVFET region 14. In embodiments, shallow trench isolation (STI) structures 165 are formed in the p-well 153b adjacent to the source contact 153a and the drain contact 164 that separate the contacts from the channel region 152. In accordance with aspects of the invention, the dielectric stack 161 includes the oxide layer 162, the nitride layer 163, and the oxide layer 164. In embodiments, the oxide layer 162 is formed directly on an upper surface of the p-well 153b below the raised gate 157, and isolation structures 19. The oxide layer 162 can also span the upper surface of the substrate from the p-well 153b into the NPN region 16. In embodiments, the oxide layer 162 has a thickness of about 200 Å; although other dimensions are also contemplated by the present invention. In accordance with aspects of the present invention, the oxide layer 162 may be used in the gate 131 of the FET 13, as previously described.

The nitride layer 163 is formed directly on the upper surface of the oxide layer 162, and can have a thickness of about 700 Å; although other dimensions are also contemplated by the present invention. The nitride layer 163 also forms the sidewall spacers of the FET 13 and can be deposited in the same process step. The oxide layer 164 is formed directly on the upper surface of the nitride layer 163 and can be comprised of any conventional oxide (e.g., $SiO_2$). In embodiments, the oxide layer 164 is about 150 Å thick; although other dimensions are also contemplated by the present invention.

Figure 3:
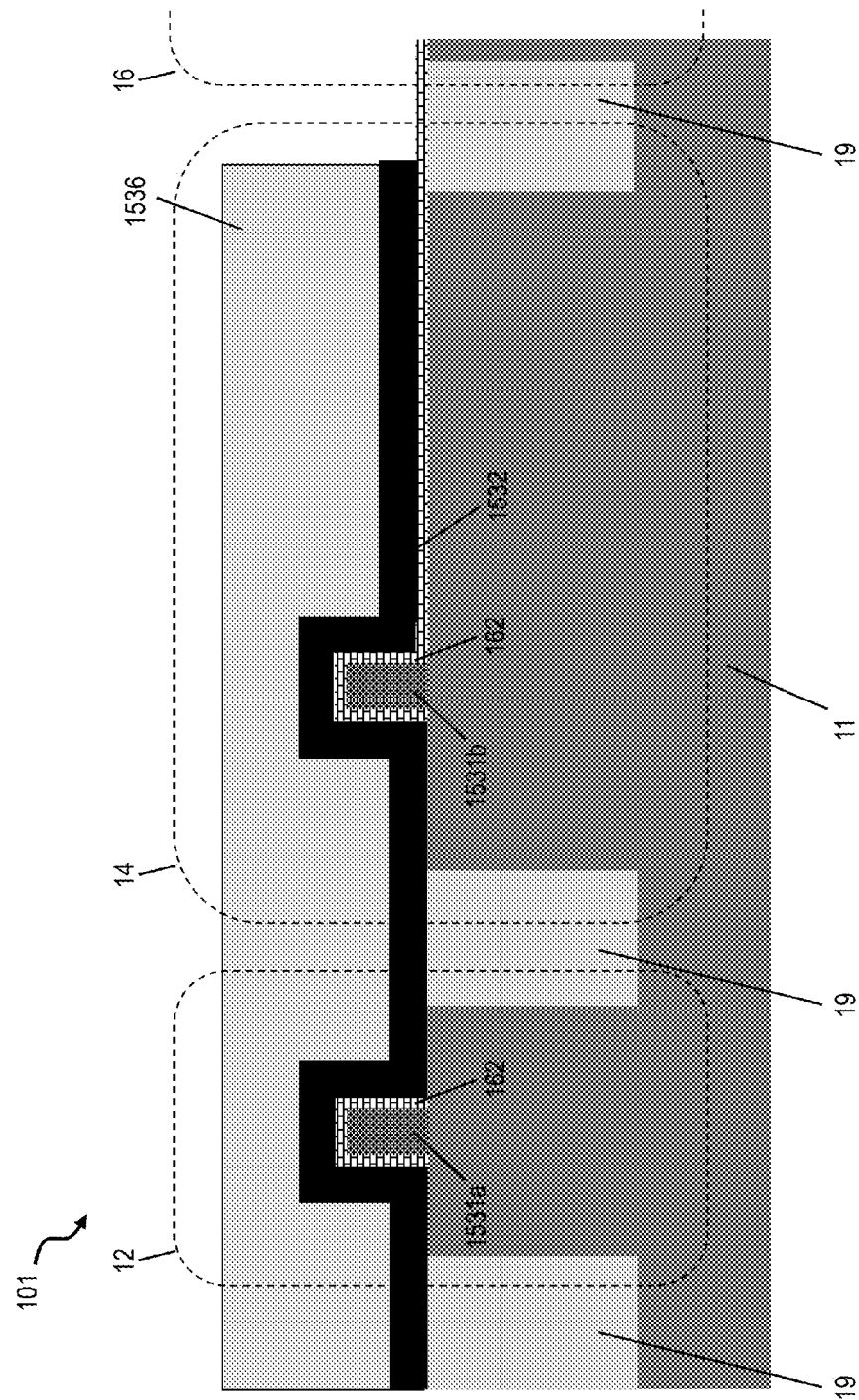
FIGS. 3-13 show structures and respective processing steps in accordance with aspects of the invention.

FIGS. 3-15 show structures and respective process steps used to manufacture the semiconductor structures shown in FIGS. 1 and 2, in accordance with aspects of the present invention. More specifically, as shown in FIG. 3, isolation structures 19 are formed in the substrate 11, using conventional lithography, etching and deposition methods. The isolation structures 19 can be include any conventional insulator material, such as oxide. Gate stack structures 1531a and 1531b are formed on the substrate 11, using conventional oxidation, deposition and etching processes. For example, the gate structures can be simultaneously formed by gate oxidation of substrate 11 surface and blanket deposition of polysilicon using conventional CVD processes. The polysilicon is then patterned using conventional lithography and etching process, e.g., reactive ion etching (RIE), to form the gate stack structures 1531a and 1531b. The gate stack structures 1531a and 1531b are formed entirely on the substrate 11 (including any structures already formed in the substrate 11, such as gate oxide, the p-well and the LDD drain) in the FET region 12 and the HVFET region 14, respectively.

An oxide layer 162 is deposited on the exposed surfaces of the substrate 11 and gate stack structures 1531a and 1531b, and patterned using conventional lithographic and etching processes. In embodiments, the oxide layer 162 is a gate oxide spacer, which can have a thickness of about 200 Å; although other dimensions are also contemplated by the present invention. In embodiments, the oxide layer 162 can be removed from the substrate 11, between the gate stack structures 1531a and 1531b.

A nitride layer 1532 is deposited to form a nitride spacer, in the FET region 12 and the HVFET region 14. By way of example, in embodiments, the nitride layer 1532 can be deposited using conventional blanket deposition methods, e.g., CVD, directly over the oxide layer 162, exposed portions of the substrate 11 and the isolation structures 19. The nitride layer 1532 can be removed from the NPN region 16 by selectively removing the nitride layer 1532 from the NPN region 16 using conventional lithography and etching processes, i.e., depositing an oxide hardmask 1536 over the FET region 12 and the HVFET region 14, and removing the exposed portions of the nitride layer 1532. In embodiments, the nitride layer 1532 is deposited to a thickness of about 700 Å; although other dimensions are also contemplated by the present invention.

Figure 4:
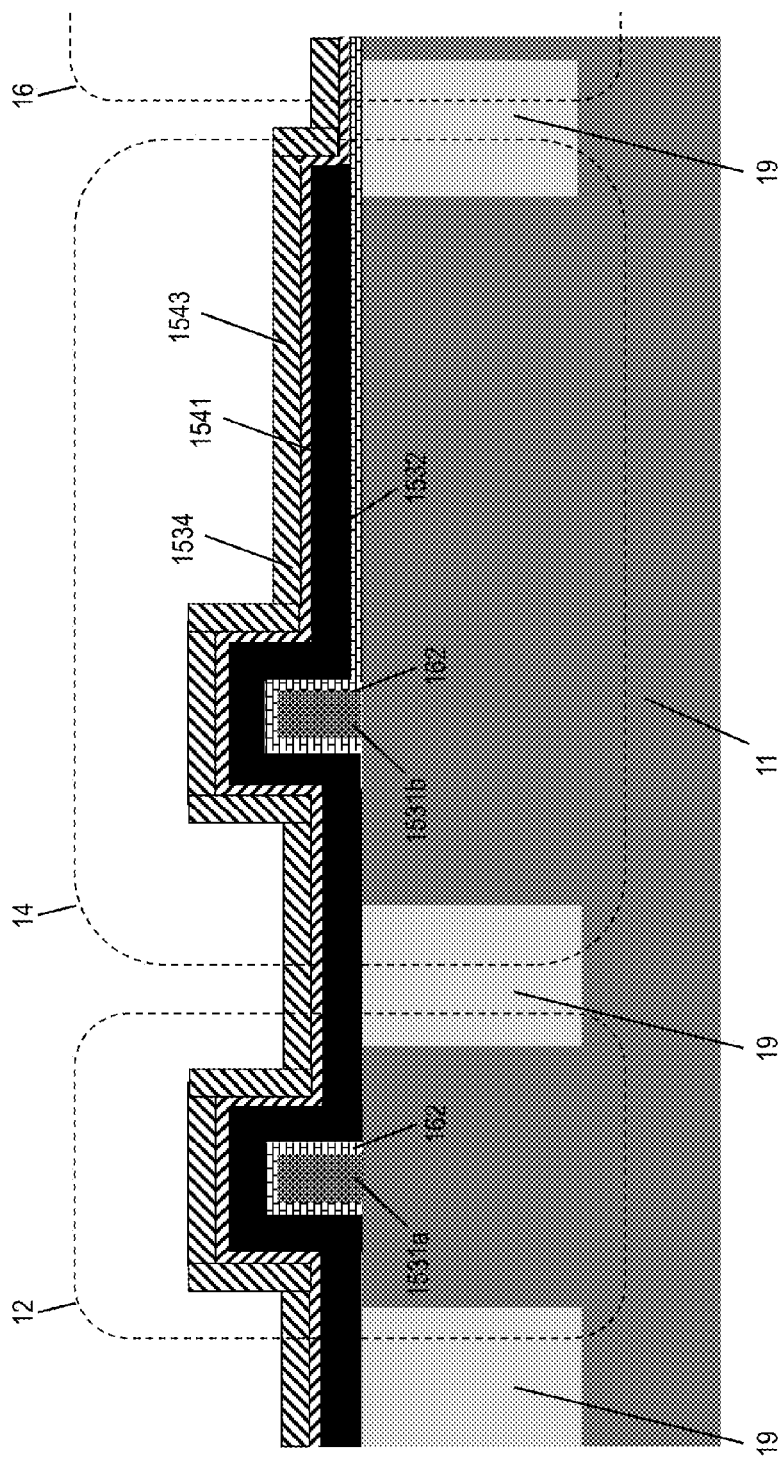

FIG. 4 shows additional processing steps and a respective structure in accordance with aspects of the present invention. In FIG. 4, the hardmask 1536 is removed from the FET region 12 and HVFET region 14 using a selective etchant. After removing the mask, an oxide layer 1541 and a polysilicon layer 1543 are formed on the upper surface of the exposed surfaces of the layer 1532 and the oxide layer 162 (in the NPN region 16) In embodiments, the oxide layer 1541 and polysilicon layer 1543 can be formed using conventional CVD processes, for example. In embodiments, the oxide layer 1541 is deposited to a thickness of about 200 Å and the polysilicon layer 1543 is deposited to a thickness of about 500 Å; although other dimensions are also contemplated by the present invention. As shown in FIG. 4, the oxide layer 1541 contacts a portion of the gate oxide layer 1532 in areas over the NPN region 16, where the mask was removed in previous processes; however, in the FET region 12 and the HVFET region 14, the oxide layer 1541 is formed directly on the layer 1532.

Figure 5:
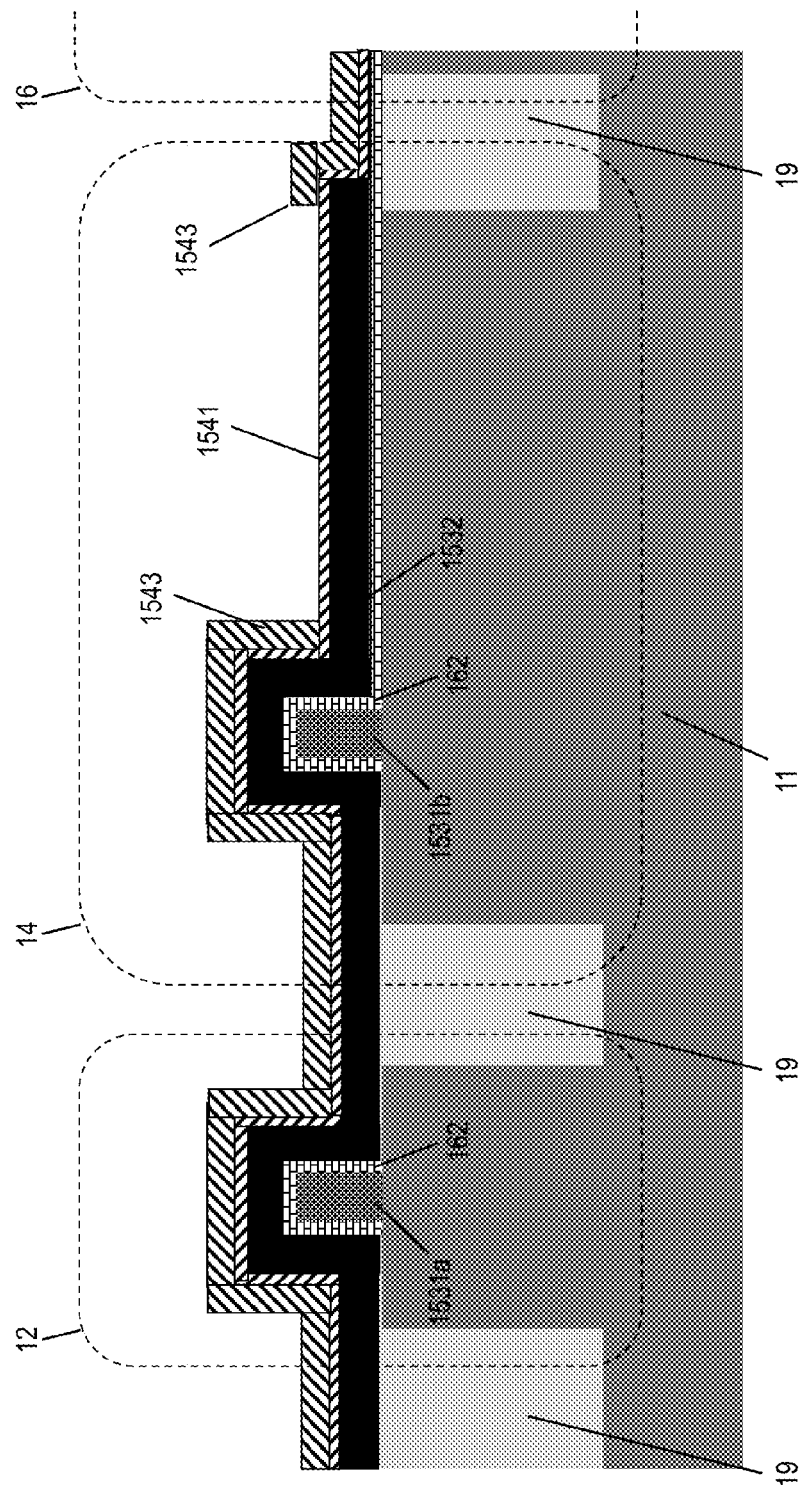

In FIG. 5, a portion of the polysilicon layer 1543 is selectively removed in a portion of the HVFET region 14. The polysilicon layer 1543 can be removed using conventional methods, such as a dry etch process. This process will expose the oxide layer 1541.

Figure 6:
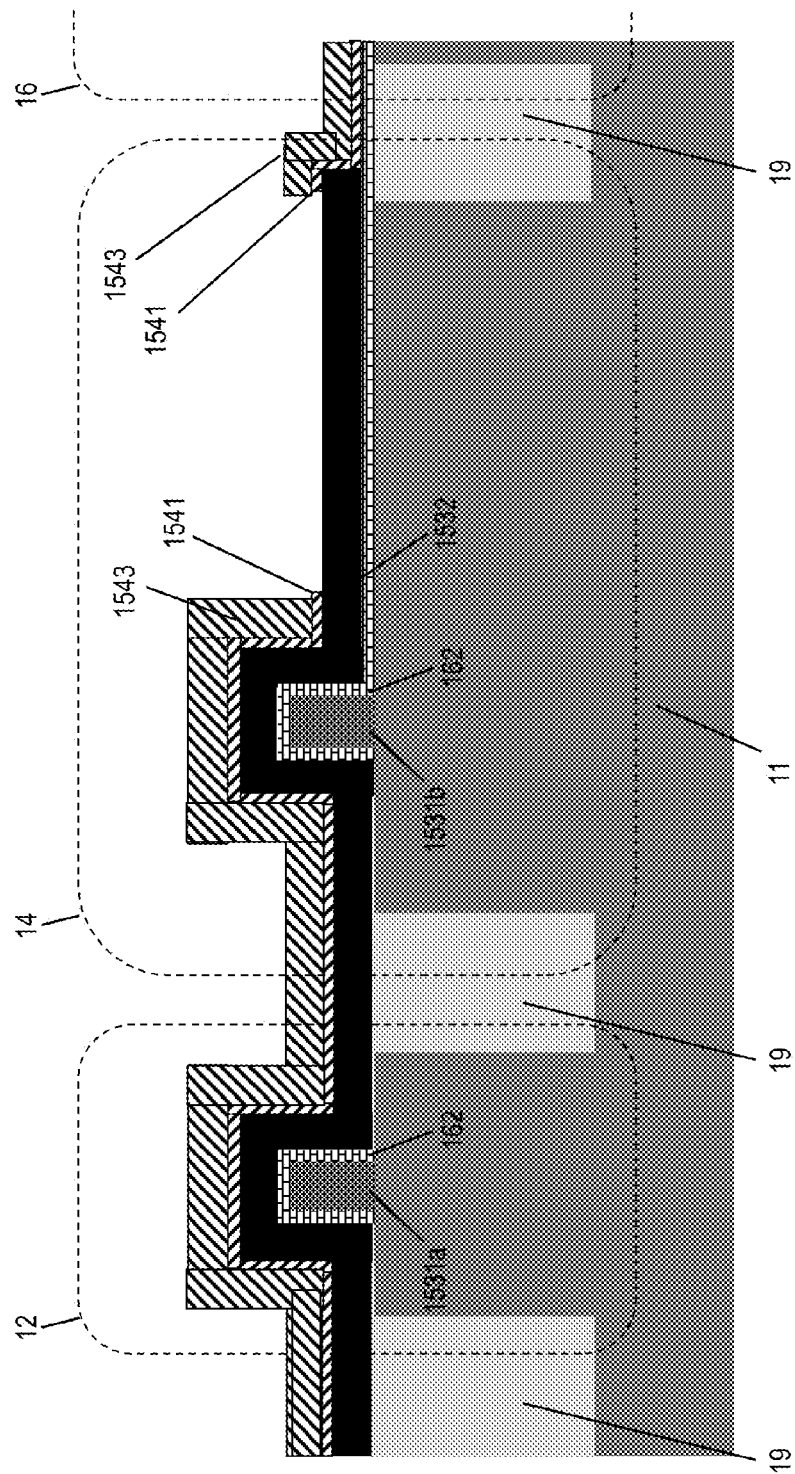

In FIG. 6, the exposed oxide layer 1541 is removed by using conventional lithography and etching processes. In embodiments, the oxide layer 1541 may be removed using a conventional reactive ion etching (RIE) process, (i.e., a dry etch). In embodiments, the removal of the oxide layer 1541 will expose the underlying nitride layer 1532 in the HVFET region 14. The HVFET region 14 can then undergo a cleaning process to remove remaining portions of the oxide layer 1541 and to expose the underlying nitride layer 1532. In accordance with aspects of the invention, a non-uniform layer of SiGe polysilicon is formed over the polysilicon 1543 to form an intrinsic SiGe base. In embodiments, the formation of the non-uniform layer of polysilicon is an epitaxial growth process, which will not form polysilicon substantially on the exposed nitride layer 1532. In embodiments, the epitaxial growth process increases the thickness of the polysilicon 1543 to about 300 Å to 500 Å. In further embodiments, a thinner layer of polysilicon can be formed over nitride layer 1532, due to the growth process.

Figure 7:
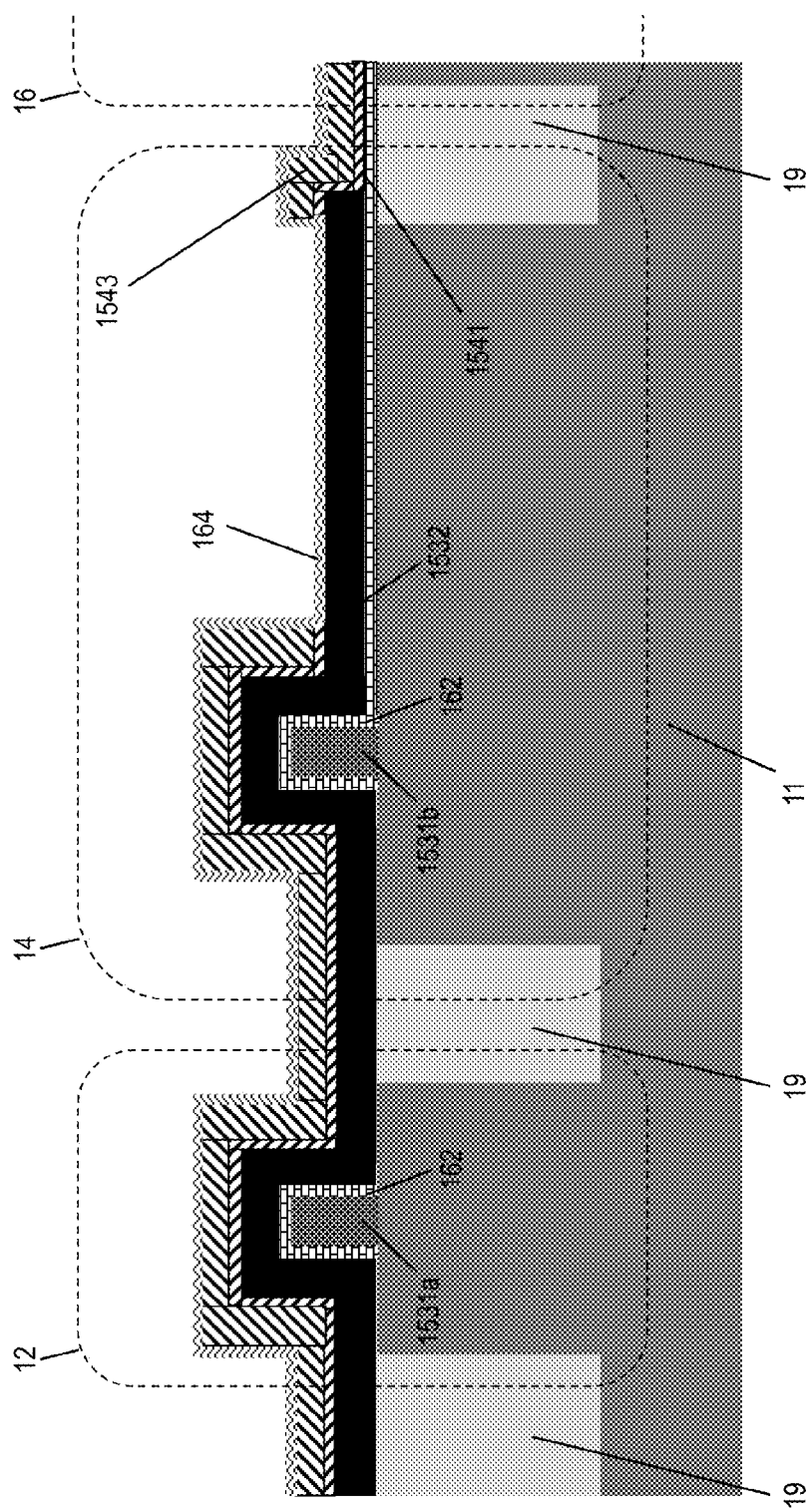

In FIG. 7, the oxide layer 164 is formed on the exposed surfaces of the structure. For example, the oxide layer 164 is formed on the polysilicon 1543 and the nitride layer 1532. The oxide layer 164 may be formed using conventional blanket deposition processes, e.g., CVD. In embodiments, the thickness of the oxide layer 164 is about 150 Å; although other dimensions are also contemplated by the present invention. In embodiments, the oxide layer 164 will form a layer of the dielectric stack.

Figure 8:
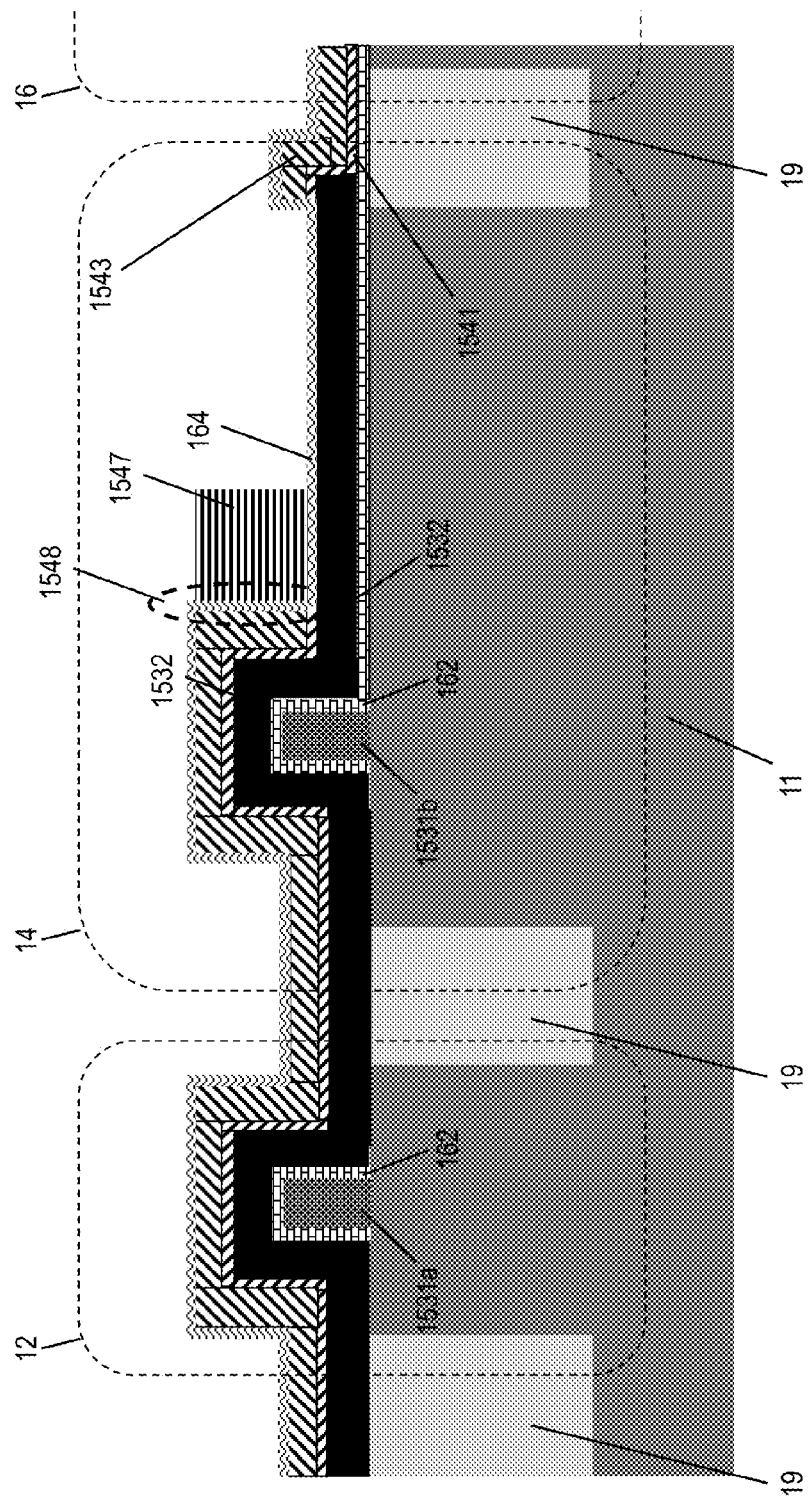

In FIG. 8, an emitter pedestal 1547 is formed over the oxide layer 164 in the HVFET region 14. In embodiments, the emitter pedestal 1547 can be formed adjacent (in direct contact) to a vertical sidewall 1548 of the oxide layer 164. In embodiments, the emitter pedestal 1547 may be formed by conventional processes, e.g., blanket deposition, lithography and etching steps. In embodiments, the emitter pedestal 1547 will be a polysilicon material, which forms a raised gate portion of the raised gate 157, as shown in FIG. 1 or 2. The emitter pedestal 1547 is about 2000 Å thick; although other dimensions are also contemplated by the present invention. In embodiments, the polysilicon material may be left as a spacer at the FET gate 131 and the control gate 151 and removed in a later stage of the process.

Figure 9:
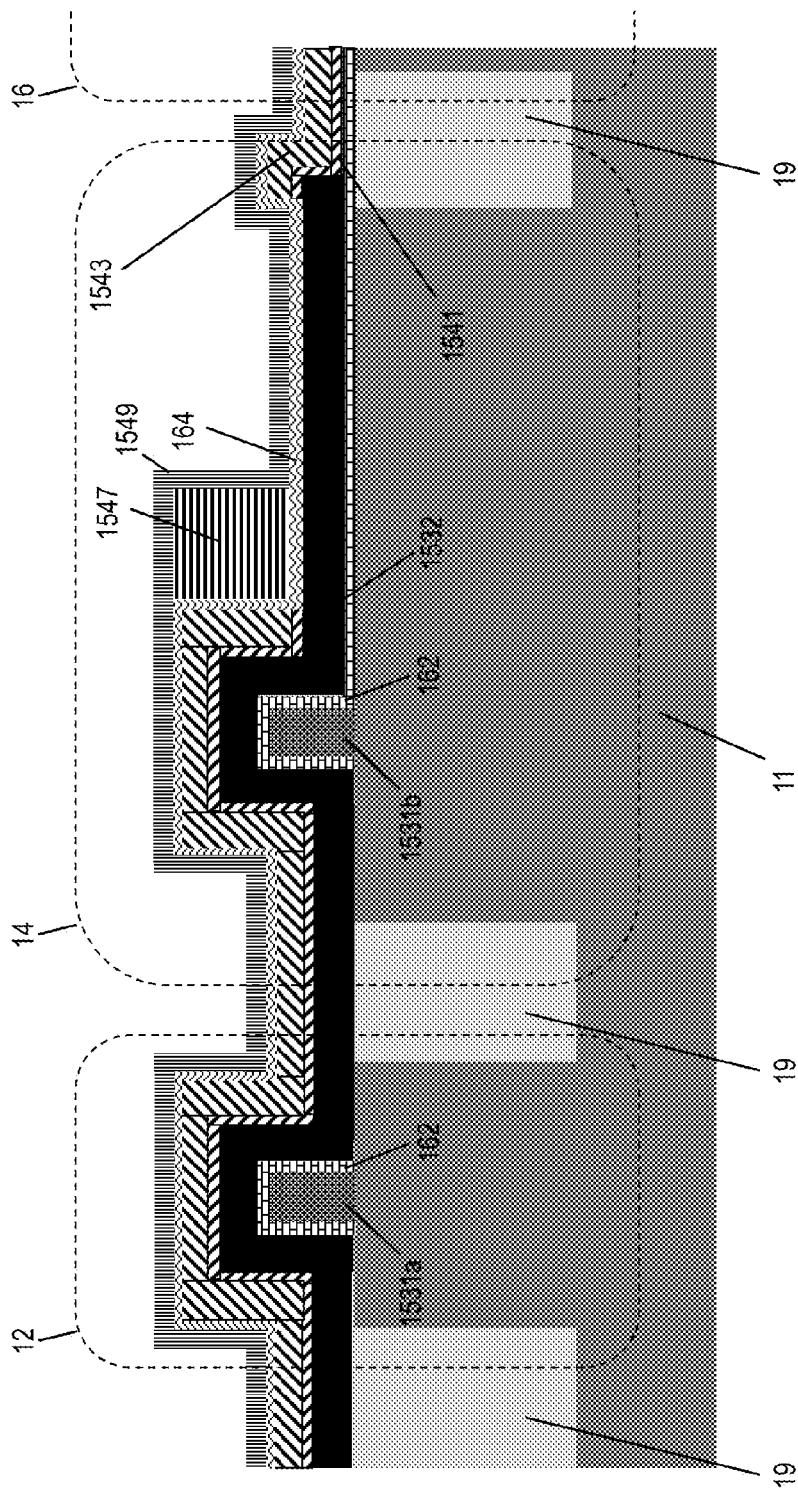

In FIG. 9, a nitride mask layer 1549 is formed over exposed portions of the upper surface of the structure of FIG. 8. For example, the nitride mask layer 1549 is formed over the upper surfaces of the FET region 12, HVFET region 14, and the NPN region 16. The nitride mask layer 1549 may be formed using conventional deposition processes, e.g., CVD. In embodiments, the thickness of the nitride layer 1549 is about 355 Å; although other dimensions are also contemplated by the present invention.

Figure 10:
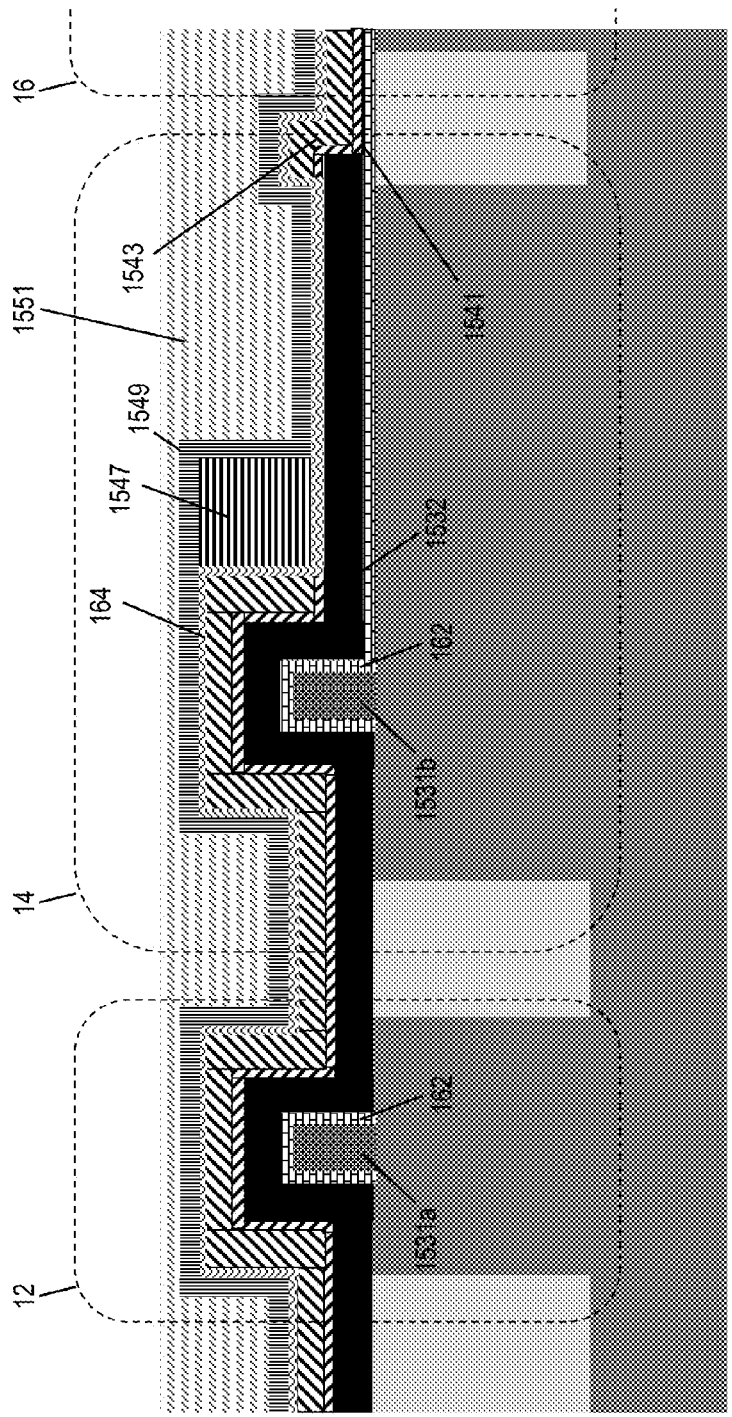

In FIG. 10, an oxide layer 1551 is formed over the entire upper surface of the structure. In embodiments, the oxide layer 1551 is formed by depositing an ozone TEOS to a thickness of about 4700 Å; although other dimensions are contemplated by the present invention. The oxide layer 1551 can then undergo a planarization process, such as CMP.

Figure 11:
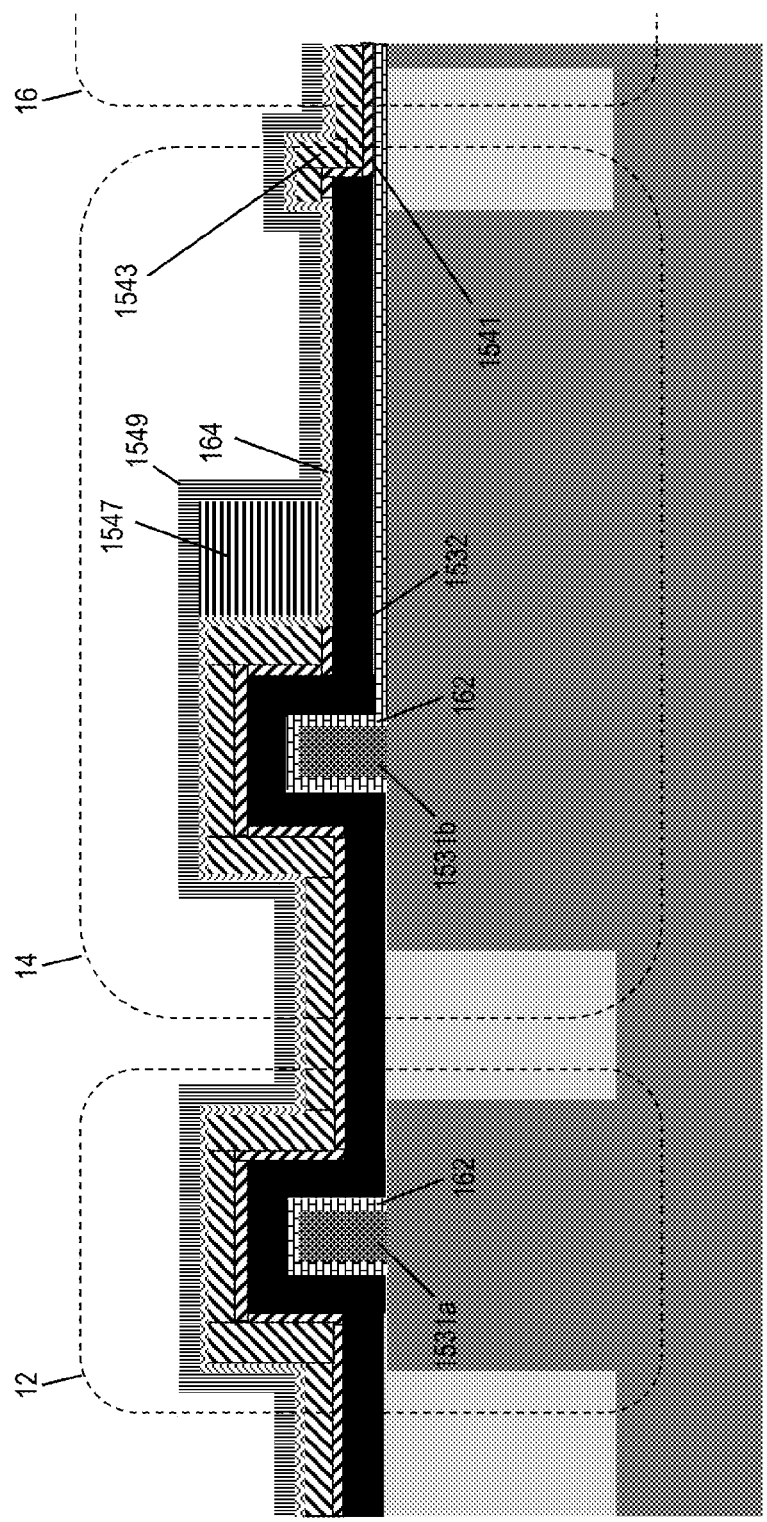

In FIG. 11, the oxide layer is incorporated into the NPN, and the remaining portions are then removed. For instance, the oxide layer 1551 may be removed using diluted hydrofluoric acid (DHF).

Figure 12:
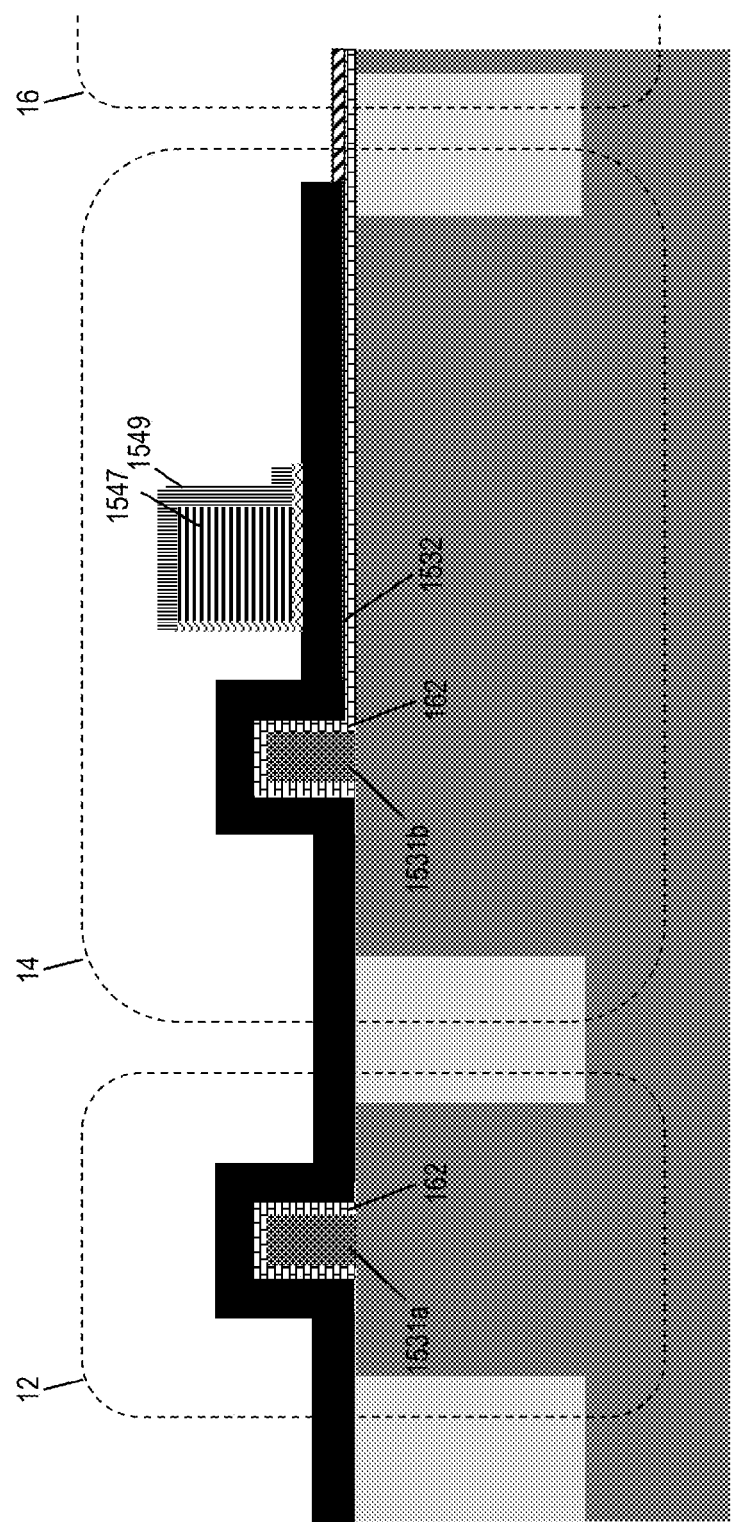

In FIG. 12, several layers are removed using selective etchants. For example, layers 164, 1541, 1543, and 1549 are selectively removed using selective etching processes. In embodiments, the nitride layer 1549 remains around the emitter pedestal 1547, in order to form sidewall spacers. In addition, oxide layer 1541 can remain in the NPN region 16, to form part of a gate dielectric stack. In embodiments, the oxide layer 164, under the nitride layer 1549 may also remain on the structure. In further embodiments, by moving the raised gate structure 1547 slightly away from the gate stack structure 1531a (which is used to form the control gate 151), it is also possible to have the nitride layer 1549 formed around the entire exposed surfaces of the raised gate structure 1547. In alternative structures, the oxide layer 1541 will be positioned between the raised gate structure 1547 and the control gate stack structure 1531*a*.

Figure 13:
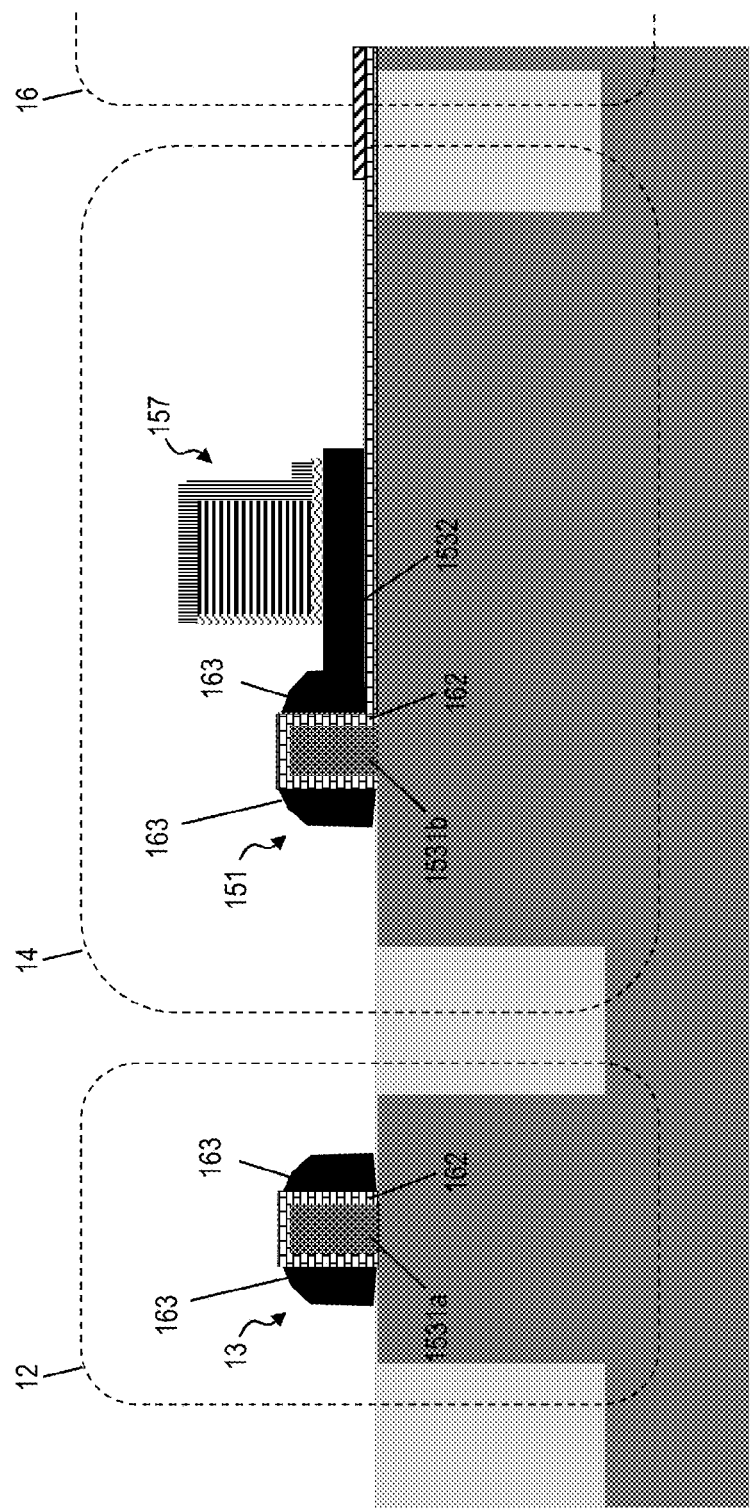

In FIG. 13, portions of the nitride layer 1532 are removed from the surface of the substrate 11, using a directional etch process, e.g., anisotropic etching process. In this way, sidewalls 163 are formed on the FET 13 and the LDMOS 15*a*. In embodiments, the control gate 151 is connected to the raised gate 157 by contacts on a metal level.

The processes described above can be used to produce the semiconductor structure 10*a*. In addition, as will be recognized by one of ordinary skill in the art, the processes shown in FIGS. 3-13 can also be used to the semiconductor structure 10*b* of FIG. 2. More specifically, one of ordinary skill in the art will recognize that the process steps in FIGS. 3-13 can be implemented to form the raised gate 157 without forming the control gate 151 to produce the HVFET 15*b* rather than the LDMOS 15*a*. Further, as noted above, the disclosed embodiments are not limited to producing an LDMOS or an HVFET; instead, the disclosed semiconductor structures and processes are also applicable to LDNMOS and LDPMOS devices with or without shallow-trench isolation (STI), High Voltage CMOS, or BCD (Bipolar-CMOS-DMOS) technologies.

Figure 14:
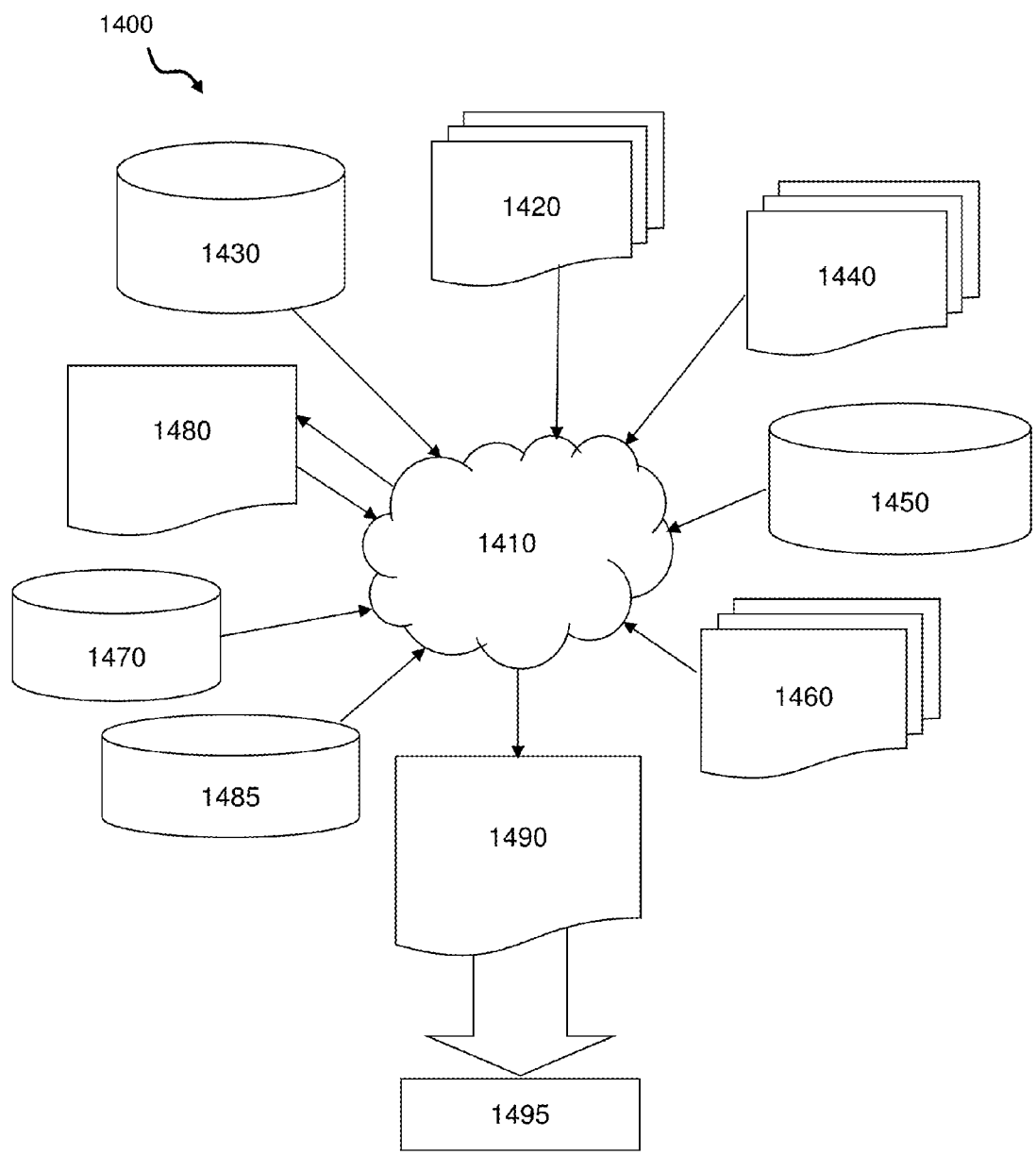
FIG. 14 is a flow diagram of a design process used in semiconductor design, manufacture, and/or test.

FIG. 14 is a flow diagram of a design process used in semiconductor design, manufacture, and/or test. FIG. 14 shows a block diagram of an exemplary design flow 1400 used for example, in semiconductor IC logic design, simulation, test, layout, and manufacture. Design flow 1400 includes processes, machines and/or mechanisms for processing design structures or devices to generate logically or otherwise functionally equivalent representations of the design structures and/or devices described above and shown in FIGS. 1-13. The design structures processed and/or generated by design flow 1400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1400 may vary depending on the type of representation being designed. For example, a design flow 1400 for building an application specific IC (ASIC) may differ from a design flow 1400 for designing a standard component or from a design flow 1400 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 1420 that is preferably processed by a design process 1410. Design structure 1420 may be a logical simulation design structure generated and processed by design process 1410 to produce a logically equivalent functional representation of a hardware device. Design structure 1420 may also or alternatively comprise data and/or program instructions that when processed by design process 1410, generate a functional representation of the physical structure of a hardware device. Whether representing functional and/or structural design features, design structure 1420 may be generated using electronic computer-aided design (ECAD) such as implemented by a core developer/designer. When encoded on a machine-readable data transmission, gate array, or storage medium, design structure 1420 may be accessed and processed by one or more hardware and/or software modules within design process 1410 to simulate or otherwise functionally represent an electronic component, circuit, electronic or logic module, apparatus, device, or system such as those shown in FIGS. 1-13. As such, design structure 1420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1410 preferably employs and incorporates hardware and/or software modules for synthesizing, translating, or otherwise processing a design/simulation functional equivalent of the components, circuits, devices, or logic structures shown in FIGS. 1-13 to generate a netlist 1480 which may contain design structures such as design structure 1420. Netlist 1480 may comprise, for example, compiled or otherwise processed data structures representing a list of wires, discrete components, logic gates, control circuits, I/O devices, models, etc. that describes the connections to other elements and circuits in an integrated circuit design. Netlist 1480 may be synthesized using an iterative process in which netlist 1480 is resynthesized one or more times depending on design specifications and parameters for the device. As with other design structure types described herein, netlist 1480 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1410 may include hardware and software modules for processing a variety of input data structure types including netlist 1480. Such data structure types may reside, for example, within library elements 1430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1440, characterization data 1450, verification data 1460, design rules 1470, and test data files 1485 which may include input test patterns, output test results, and other testing information. Design process 1410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1410 without deviating from the scope and spirit of the invention. Design process 1410 may also include modules for performing standard circuit design processes such as timing analysis, verification, design rule checking, place and route operations, etc.

Design process 1410 employs and incorporates logic and physical design tools such as HDL compilers and simulation model build tools to process design structure 1420 together with some or all of the depicted supporting data structures along with any additional mechanical design or data (if applicable), to generate a second design structure 1490.

Design structure 1490 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1420, design structure 1490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-13. In one embodiment, design structure 1490 may comprise a compiled, executable HDL simulation model that functionally simulates the devices shown in FIGS. 1-13.

Design structure 1490 may also employ a data format used for the exchange of layout data of integrated circuits and/or symbolic data format (e.g. information stored in a GDSII (GDS2), GL1, OASIS, map files, or any other suitable format for storing such design data structures). Design structure 1490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-13. Design structure 1490 may then proceed to a stage 1495 where, for example, design structure 1490: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A high-voltage metal-insulator-semiconductor field-effect transistor structure comprising:
   a field-effect transistor (FET) on a substrate in a FET region;
   a high-voltage FET (HVFET) on a dielectric stack over a lightly-doped diffusion (LDD) drain in the substrate in a HVFET region, wherein the dielectric stack comprises a first insulator layer on the substrate and a first mask layer on the first insulator layer;
   an NPN on the substrate in an NPN region; and
   a second insulator layer contacting a portion of the first insulator layer in an area over the NPN region.

2. The structure of claim 1, wherein:
   the FET is comprised of a gate structure in the FET region; and
   the HVFET comprises:
   a gate structure in the HVFET region adjacent to the dielectric stack and comprised of a same material as the gate structure in the FET region; and
   a raised gate structure on the dielectric stack in the HVFET region.

3. The structure of claim 1, wherein:
   the FET is comprised of a gate structure in the FET region; and
   the HVFET is comprised of a raised, gate structure formed on the dielectric stack.

4. The structure of claim 1, wherein the first insulator layer comprises an insulator layer in the first gate structure.

5. The structure of claim 1, wherein the first mask layer comprises sidewalls of the first gate structure.

6. A high-voltage metal-insulator-semiconductor field-effect transistor structure comprising:
   a field-effect transistor (FET) on a substrate in a FET region;
   a high-voltage FET (HVFET) on a dielectric stack over a lightly-doped diffusion (LDD) drain in the substrate in a HVFET region; and
   an NPN on the substrate in an NPN region,
   wherein the dielectric stack comprises a first insulator layer on the substrate and a first mask layer on the first insulator layer; and
   the HVFET comprises a second insulator layer and a first polysilicon layer over exposed surfaces of the first mask layer and the first insulator layer, wherein the second insulator layer contacts a portion of the first insulator layer in an area over the NPN region; and the second insulator layer is directly on the first mask layer in the FET region and the HVFET region.

7. The structure of claim 6, wherein the HVFET comprises an intrinsic SiGe base on the first polysilicon layer.

8. The structure of claim 7, wherein the HVFET comprises a third insulator layer on the polysilicon layer and the first mask layer.

9. The structure of claim 8, wherein the forming the HVFET comprises forming a raised emitter over the third insulator layer in the portion of the HVFET region in which the first mask layer was exposed.

10. The structure of claim 1, wherein the LDD drain is in the substrate.

11. The structure of claim 1, wherein the dielectric stack comprises:
   a first layer of a plurality of stacked dielectric layers directly on an upper surface of the LDD drain;
   a second layer of the plurality of stacked dielectric layers directly on an upper surface of the first layer;

a third layer of the plurality of stacked dielectric layers directly on an upper surface of the second layer; and a raised gate on an upper surface of the third layer.

12. The structure of claim 1, wherein:

the FET comprises a first gate structure in the FET region;

the HVFET comprises a raised, second gate structure on the dielectric stack; and the dielectric stack comprises:
- the first insulator layer on the substrate, the first insulator layer also forming an insulator layer in the first gate structure; and
- the first mask layer on the first insulator layer, the first mask layer also forming sidewalls of the first gate structure.

* * * * *